(12) United States Patent
Viswanathan

(10) Patent No.: US 6,441,761 B1
(45) Date of Patent: Aug. 27, 2002

(54) HIGH SPEED, HIGH RESOLUTION DIGITAL-TO-ANALOG CONVERTER WITH OFF-LINE SIGMA DELTA CONVERSION AND STORAGE

(75) Inventor: Thayamkulangara R. Viswanathan, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/725,664

(22) Filed: Nov. 29, 2000

Related U.S. Application Data
(60) Provisional application No. 60/169,819, filed on Dec. 8, 1999.

(51) Int. Cl.⁷ .................................................. H03M 1/66
(52) U.S. Cl. ....................... 341/144; 341/143; 341/144; 341/150; 341/153
(58) Field of Search ................................ 341/144, 143, 341/150, 153

(56) References Cited

U.S. PATENT DOCUMENTS

| | | | |
|---|---|---|---|
| 4,901,077 A | | 2/1990 | Christopher ................. 341/143 |
| 5,012,245 A | * | 4/1991 | Scott et al. |
| 5,079,551 A | | 1/1992 | Kimura et al. ............... 341/143 |
| 5,313,205 A | | 5/1994 | Wilson ........................ 341/144 |
| 5,537,113 A | * | 7/1996 | Kawabata |
| 5,539,403 A | * | 7/1996 | Tani et al. |
| 5,701,106 A | | 12/1997 | Pikkarainen et al. ........ 332/100 |
| 5,712,635 A | | 1/1998 | Wilson et al. ............... 341/144 |
| 5,786,779 A | | 7/1998 | Chun et al. ................... 341/61 |
| 5,815,102 A | | 9/1998 | Melanson ..................... 341/143 |
| 5,920,273 A | | 7/1999 | Hirano ......................... 341/144 |
| 5,952,947 A | | 9/1999 | Nussbaum et al. .......... 341/143 |

OTHER PUBLICATIONS

A Second–Order Double–Sampled Delta–Sigma Modulator Using Individual–Level Averaging; Chuc K. Thanh et al., 1997 IEEE Journal of Solid–State Circuits, vol. 32, No. 8, Aug. 1997, pp. 1269–1273.

\* cited by examiner

*Primary Examiner*—Michael Tokar
*Assistant Examiner*—Linh Van Nguyen
(74) *Attorney, Agent, or Firm*—April M. Mosby; W. James Brady; Frederick J. Telecky, Jr.

(57) ABSTRACT

A digital-to-analog conversion circuit (105) includes a storage means (110), such as a read only memory, for storing delta-sigma analog sequences corresponding to all possible values of a digital input (106) coupled to a plurality of one-bit digital to analog converters (120, 122, 124, 126). Each of the digital-to-analog converters (120, 122, 124, 126) are clocked by multi-phase clocks, such that each phase applied to each one of the digital-to-analog converters (120, 122, 124, 126) is delayed with respect to one another by the oversampling period. An summer is coupled to each digital-to-analog converter (120, 122, 124, 126) for summing each output from each digital-to-analog converter (120, 122, 124, 126) to generate an analog output. Hereby, the digital-to-analog conversion circuit (105) according to the invention emulates a delta-sigma digital-to-analog converter having both high speed and high resolution.

6 Claims, 3 Drawing Sheets

HIGH SPEED, HIGH RESOLUTION DIGITAL-TO-ANALOG CONVERTER WITH OFF-LINE SIGMA DELTA CONVERSION AND STORAGE

CROSS REFERENCE TO RELATED APPLICATIONS

This application claims the benefit of provisional application No. 60/169,819 filed Dec. 8, 1999.

This invention applies to the cellular base station having high-speed, high resolution digital-to-analog converter from our copending application (TI-29961), Ser. No. 09/725,665, filed Nov. 29, 2000. This application is incorporated by reference herein.

FIELD OF THE INVENTION

This invention pertains to digital-to-analog (D/A) converter and more particularly to an apparatus and method for performing high speed and high resolution digital-to-analog conversion using the oversampling principle.

BACKGROUND OF THE INVENTION

Digital-to-analog conversion refers to the process of converting discrete digital signals into a continuous-time range of analog signals. The conversion of analog signals to digital signals and vice versa is often used in order to interface real world systems, many of which monitor continuously varying analog signals, with digital systems that read, store, interpret, manipulate and otherwise process the discrete values of sampled analog signals. Real world applications which use digital-to-analog converters (DACs) include, for example, digital audio systems such as compact disc players, digital video players, and various other high performance audio applications, which include conversion of digital signals to analog waveforms at a high resolution.

Sigma-delta modulation (sometimes called "delta-sigma modulation") provides a high resolution digital-to-analog conversion solution. Sigma-delta DACs have come into widespread use with the development of process and digital audio technologies and their applications. Sigma-delta modulation incorporates a noise-shaping technique whereby the noise of a quantizer (often 1-bit) operating at a frequency much greater than the bandwidth is moved to high frequencies not of interest in the output signal. A filter after the quantizer removes the out-of-band noise. The resulting system synthesizes a high resolution data converter, but is constructed from low resolution building blocks. Since sigma-delta DACs provide for oversampling digital-to-analog conversion through the sampling of signals at very high frequencies (i.e., sampling at rates much greater than the Nyquist rate), high signal-to-noise ratios are achieved. Thus, the combination of oversampling and noise shaping technologies may be implemented using a sigma-delta DAC in order to achieve high resolution without external trimming. There, however, does not exist a present digital-to-analog convertion that provides both high speed and high resolution. A good overview of the theory of sigma-delta modulation is given in "Oversampling Delta-Sigma Data Converters," by Candy and Temes, IEEE Press, 1992. Examples of D/A converters utilizing delta-sigma modulation are given in U.S. Pat. Nos. 4,901,077; 5,079,551; 5,185,102; 5,313,205; 5,701,106; 5,712,635; 5,786,779; 5,920,273; and 5,952,947. The disclosures of the foregoing references are incorporated herein.

Specifically, sigma-delta DACs commonly include a front-end interpolator which receives digital input samples and increases the sampling rate (typically 64–256 times the input sample rate) of the digital input samples. The sigma-delta modulator receives the higher frequency input samples from the interpolator and converts the samples to a lower resolution (typical one-bit), high frequency bit stream. Rather than spreading quantization noise uniformly over the frequency range from 0 to the sampling Nyquist frequency, the sigma delta modulator shapes the noise so that the majority of the noise falls into the very high frequencies above the Nyquist frequency. Thus, it effectively removes the noise from the lower frequency range which is of interest for the particular applications cited above. Techniques for increasing the sample rate, generally called interpolation, are well understood by those skilled in the art. Most designs will utilize several stages of increase.

An oversampling DAC which utilizes a second order sigma-delta quantizer and an analog low pass filter to convert the data from the sigma-delta quantizer to analog signal is a very effective device for low speed audio applications; yet, inadequate for high speed applications. In addition, it has a relatively high output data transition rate, requiring higher power than is desirable. Moreover, considering oversampling interpolations on the order of n=256 for high sampling rates, such as the 400M samples/sec required for cellular base station applications, extreme clocking speeds (400 MHz×256) become a serious design obstacle.

Thus, there exists a need for an improved DAC operable at higher speed than heretofore achievable which exploits the sigma-delta principle in a different way.

SUMMARY OF THE INVENTION

For providing a solution to the above described need, the digital-to-analog conversion circuit according to the invention comprises a storage means for storing delta-sigma bit sequences corresponding to all possible values of a digital input coupled to a plurality of one-bit digital to analog converters. Each of the digital to analog converters are clocked by multi-phase clocks such that each phase applied to each one of the digital to analog converter is delayed with respect to a next one by the oversampling period, which is the Nyquist period divided by the number of predetermined interpolated samples. An analog summer is coupled to all the digital-to-analog converters for summing all the outputs from the plurality of digital to analog converters to generate an analog output. Hereby, the digital-to-analog conversion circuit according to the invention emulates a delta-sigma digital-to-analog converter having both high speed and high resolution.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
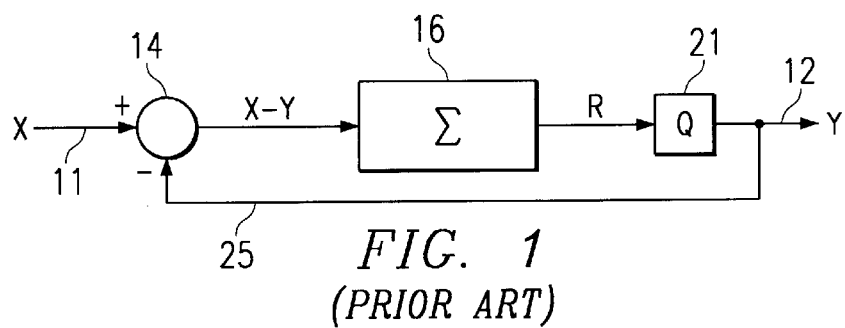
FIG. 1 is a schematic of a known first order sigma-delta converter.

The present invention is best understood by comparison with the prior art. Hence, this detailed description begins with a discussion of a well-known first order sigma-delta quantizer, as shown in FIG. 1. The purpose of this quantizer in a D/A converter is to convert a high resolution digital signal $x_i$, 11, having several bits (16, for example) into a single-bit code $y_i$, 12, which can be accurately converted to analog. Input 11 is fed to the quantizer 21 via an integrator 16, and quantized output 12 is fed back as feedback 25 and subtracted using adder 14 from the input. Quantizer 21 generates a 1-bit output depending upon whether the output of the integrator is positive or negative. The quantizer function is modeled as adding the output of integrator 16 to an error signal $e_i$ (not shown). This modeling allows the calculation of the spectrum of the noise to be done in a straightforward manner.

For large positive inputs, the integrator output will be positive. A logic one is then the output of the quantizer, which is fed back and subtracted from the input. The series of output ones continues until the integrator output, which is ramping down due to the negative feedback, finally crosses the quantizer threshold, at which point the quantizer outputs a negative one. Over time, the average output $y_i$ equals the input $x_i$. The system is called a first order sigma-delta converter, because a single integrator stage is used.

Figure 2:
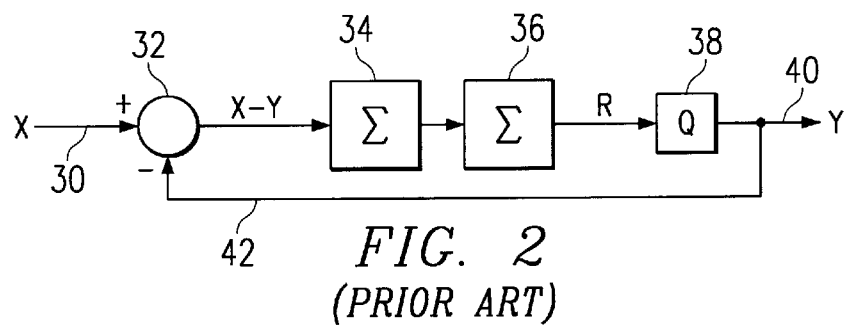
FIG. 2 is a schematic of a known second order sigma-delta converter.

FIG. 2 shows a common second order sigma-delta quantizer. In many D/A conversion applications, sigma-delta modulators are chosen to be at least second order because higher order modulators better reduce noise in the signal band, due to improved prediction of the in-band quantization error. Thus, the resulting signal-to-noise ratio is better. Second order sigma-delta modulators are still relatively stable and easy to design. However, third and higher order modulator design can become quite complex.

For the quantizer of FIG. 2, input $x_i$, 30, is added to feedback signal 42 by adder 32. The signal from adder 32 is fed into first accumulator 34. The output of accumulator 34 is fed into second accumulator 36. The output of accumulator 36 goes into quantizer 38. The residue or error signal $e_i$ (not shown) is added to the input $x_i$ by adder 32. Quantized output 38 also feeds back as feedback signal 42. Quantizer 38 may quantize the signal into ones and zeroes (1-bit format) or into multiple levels.

For simplicity, oversampling by repeating the input data at higher frequencies is considered. The analysis of a delta-sigma loop with constant input is simple. It can be assumed that the residue R output of the integrator 16 in FIG. 1 remains bounded to a small value (denoted by $\epsilon$ because of the negative feedback around the loop). The residue R is equal to the error in the input sequence $x_i$ minus the output sequence $y_i$, as follows:

$$\Sigma(x_i - y_i) = R \rightarrow \epsilon$$

For n times oversampling using repetition of the input data n times between Nyquist samples, since $x_i$ is constant for the n iterations, after n iterations of the loop, this error reduces to $\epsilon/n$.

$$\Sigma x_i - \Sigma y_i = \epsilon$$

$$n\Sigma x - \Sigma y_i = \epsilon$$

$$x = (1/n)\Sigma y_i + (1/n)\epsilon$$

In a second order loop, there are two integrators in tandem. The input gets accumulated as x, 2x, 3x, ... nx in the first integrator. In turn, the second integrator will contain as x, 3x, 6x, ... n(n+1)x/2 due to the input samples alone. Thus, the error goes down in a quadratic fashion as $2/(n^2+n)$.

$$\Sigma\Sigma x_i - \Sigma\Sigma y_i = \epsilon$$

$$\{n(n-1)/2\}\Sigma\Sigma x - \Sigma\Sigma y_i = \epsilon$$

$$x = (2/(n^2+n))\Sigma\Sigma y_i + (2/(n^2+n))\epsilon$$

In other words, by increasing the order of the loop or n, one can make the error negligibly small as the stored value grows in proportion to n.

Figure 3:
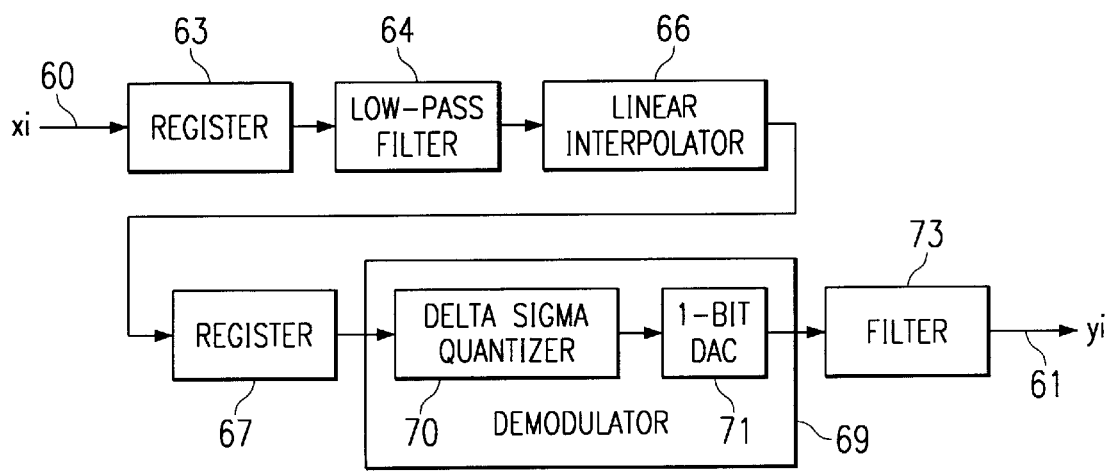
FIG. 3 shows a known over-sampling DAC system having the known first order sigma-delta converter of FIG. 1.

As disclosed in U.S. Pat. No. 5,815,102, which is incorporated by reference herein, FIG. 3 shows an oversampling D/A converter which utilizes a second order sigma-delta quantizer 70 and a one-bit D/A converter 71 as the demodulator 69, and a low pass filter 73 to remove the noise from the 1-bit signal. Oversampling is used to increase resolution by reducing quantization error to a small value. Techniques for increasing the sample rate, generally called interpolation, are well understood by those versed in the art. Typical techniques, among many, include zero stuffing and data repetition.

In FIG. 3, the input signal $x_i$, 60, consists of data encoded into 16-bit words at 8 kHz. These words are placed into a register 63 from which they are fed into a low pass filter 64 at 32 kHz, with each word repeated four times. The low pass filter is of the finite impulse response type. The linear interpolator 66, which is also a low pass filter, inserts three new words between each pair of words from low pass filter 64, which raises the data rate to 128 kHz. These words are fed into a second register 67, which feeds each word into the demodulator 69, repeating each word eight times, resulting in a data rate of 1 MHz. This repeating of the samples is a simple type of low pass filter. The 1 MHz sample rate is a sufficiently high data rate for audio applications so that the quantization noise which will be introduced into the signal is small, and the requirements of the analog smoothing filter are easily met. Output $y_i$, 61, is an analog signal. For audio applications, the output of demodulator 69 can sometimes be driven directly into a speaker, because the speaker can act as a low pass filter. This configuration uses what is called class D output or pulse density modulation drive. Power dissipation in a class D stage has the potential for being very low, as the output transistors are always in either a fully shorted or open position, removing most resistive power consumption.

An oversampling D/A converter like that of FIG. 3, which utilizes a second order sigma-delta quantizer 70, and a low pass filter 71 to convert the data from the sigma-delta quantizer 70 to analog signal $y_i$, 61, is a very effective device for low speed sampling such as for low speed audio applications. However, it has a relatively high output data transition rate, requiring higher power than is desirable. Moreover, at high speed sampling rates, such as the, for example, 200 MHz sampling required for cellular base station applications, and oversampling interpolations on the order of n=256 times oversampling, extreme clocking speeds (400 MHz×256) becomes a serious design obstacle.

Figure 4:
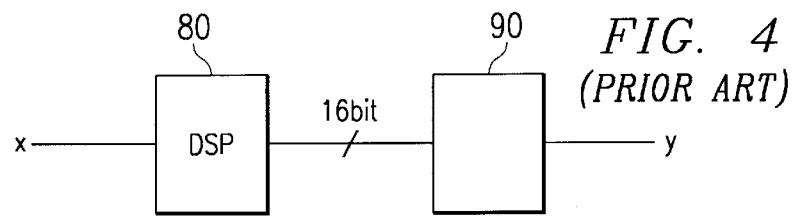
FIG. 4 illustrates the prior art digital signal processor and DAC arrangement.

Oversampling may be achieved by any given interpolation procedure. For example, where over-sampling is performed on a sample which is held constant for a whole Nyquist period, the interpolation reduces to repeating the input sample value n-times where n is the oversampling ratio. A sample and hold operation results in a lowpass filtering function and this is the well known (sin X)/X function. FIG. 4 shows a known implementation using a digital signal processor 80 coupled to the an oversampling sigrna-delta modulator. The digital signal processor calculates the sequence values with the incoming signal in real time and the sigma-delta converter operates at oversampling rate. This, however, turns out to be an unnecessary and power-hungry operation.

Figure 5:
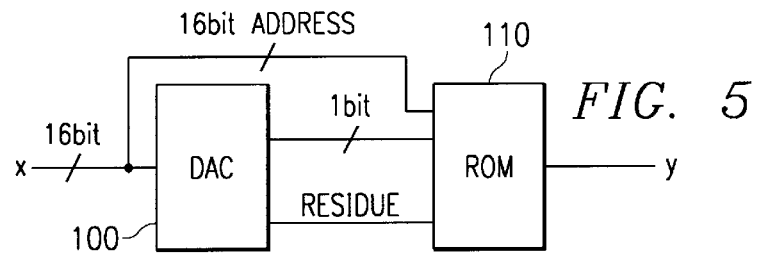
FIG. 5 illustrates a first order sigma-delta converter coupled to a read only memory to program.

FIG. 5 illustrates the apparatus used which provide off-line processing of output sequences in accordance with the present invention. A 16-bit input word is received by a sigma-delta converter 100 that is coupled to a read-only memory 110. The input signal and the output signal of the sigma-delta converter 100 is coupled to the read-only memory 110 to be stored as a table. In operation, sigma delta conversion pre-calculated off-line to generate the output sequence as well as residue if not negligible. This becomes possible since the conversion of one value of the signal is independent of the previous history of the inputs. Thus, the 65,536 values corresponding to all possible 16-bit inputs can be fed on a one-at-a-time basis into the off-line sigma delta converter. The converter runs for n cycles where n is the oversampling factor. The output sequence of n bits and residue obtained from this off-line computation are stored in a read-only memory 110 addressable by a 16-bit input word.

Figure 6:
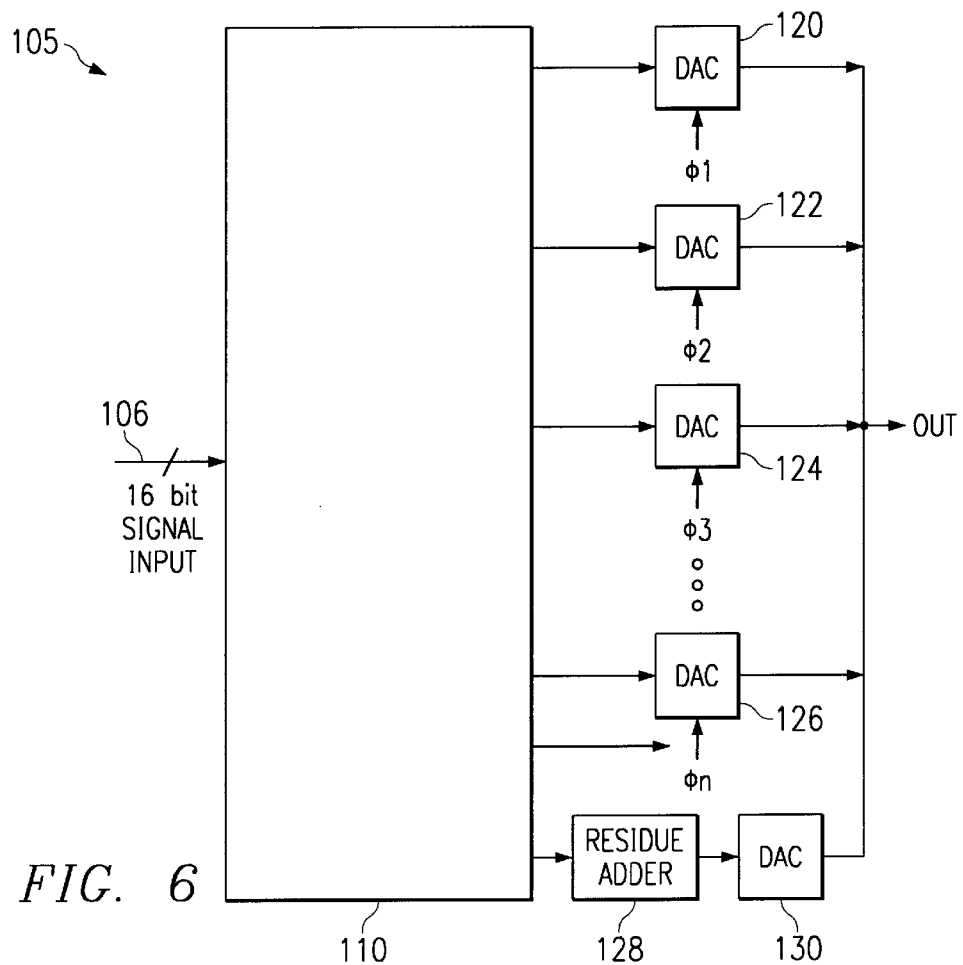
FIG. 6 illustrates an embodiment of a sigma-delta modulator in accordance with the present invention.

FIG. 6 displays a high speed, high resolution digital-to-analog converter 105 in accordance with the present invention. A 16-bit input word at the input signal 106 addresses the read-only memory 110 of FIG. 5 that contains the pre-computed delta-sigma values corresponding to all possible 16-bit inputs. The values stored in the read-only memory 110 when addressed by the input signal 106 will output all the stored values of the sigma delta sequence simultaneously. The output can be converted to the required analog signal by using a plurality of one bit digital to analog converters (DACs) 120, 122, 124 and 126 coupled to the n outputs of ROM 110, each clocked by multi-phase clocks each delayed with respect to the next by the oversampling period. The data stored in ROM 110 is compressed if necessary to minimize the number of storage cells or size of the ROM 110. Depending upon what is stored in ROM 110, the data output from the ROM 110 may be in variety of useful, low transition rate formats.

Figure 7:
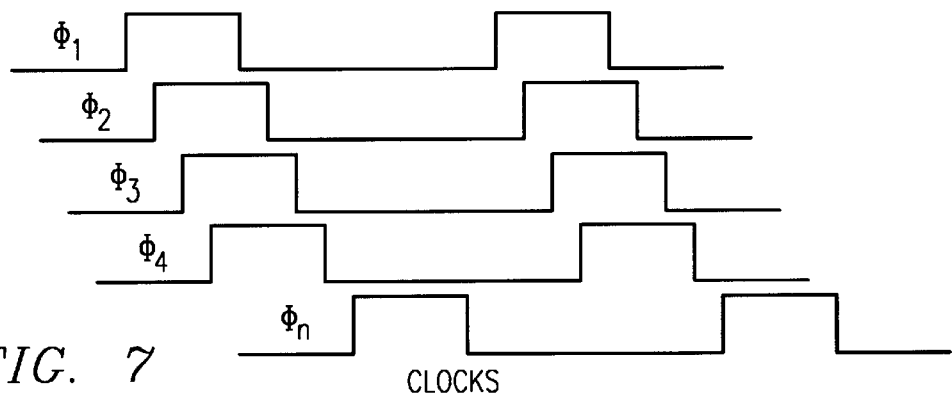
FIG. 7 shows the timing diagram of the clocking signals for each one-bit DAC in the sigma-delta modulator in accordance with the present invention.

Given a delay-lock loop and n one-bit DAC's 120, 122, 124 and 126, when the memory is addressed by an input, the whole stored bit-sequence as well as the residue is transferred to the output simultaneously. The sequence is stored as a column, these bits are fed to the DAC's 120, 122, 124 and 126 in parallel as shown. Each DAC 120, 122, 124 and 126 may be implemented using a current steering arrangement having a single differential pair and a tail current source. Each differential pair is switched by a clocked flip-flop thereby transferring current from one side to the other. The DAC's 120, 122, 124 and 126 are clocked with delayed clocks shown in FIG. 7. The delay between adjacent clocks is the T/n where T is the Nyquist period. This multi-phase clock must be obtained using a delay-lock loop with very low jitter. For improved accuracy reasons, if stored residues are outputted, a separate residue adder 128 and DAC 130 will be necessary. These values will be added in the digital domain. Only when the value of the residue becomes appreciable (i.e. when the most significant bit becomes one) will it be converted to analog and added to the output as a correction.

The analog output obtained by summing all the DAC 120, 122, 124 and 126 outputs then emulates a sigma-delta DAC yet this embodiment provides both high speed and high resolution not possible by prior art sigma-delta solutions. Note that this output has shaped quantization-noise at high frequencies above the oversampling rate that must be filtered out. A convenient way to do this, as disclosed in U.S. Pat. No. 5,012,245 (which is incorporated herein), is to use an FIR filtering technique which is obtained simply by adjusting the tail currents of the various DAC's 120, 122, 124 and 126 to correspond to the coefficients of the filter. Multiplication is trivial when one of the operands is a +1, −1 or 0. Note that inaccuracies in coefficients of the filter will not introduce non-linearity or spurs but will only change the frequency response of the filter.

The high speed, high resolution digital-to-analog converter 105 can be used in a variety of telecommunication and other applications. Conveniently, digital-to-analog converter 105 can be part of cellular phones operating according to international standards, such as for example CDMA (Code Division Multiple Access) and GSM (Global System for Mobile Communication). Digital-to-analog converter 105 can be use in any data communication system, hard disk drive, cd player, video display, and any other application where there is a large amount of data that must be converted quickly.

Another embodiment may include the incorporation of a second-order sigma-delta loop, to obtain 100 dB dynamic range, the oversampling ratio is 128. This means that the read-only store is 65K×128 bits. If a higher order loop or a multi-bit delay loop is utilized, the oversampling ratio will be smaller; however, the DAC 105 becomes more complex although the number of DAC's 120, 122, 124 and 126 as well as the number of clock-phases reduces.

An alternate embodiment may include an apparatus to apply the optimum number of taps and the tap weight coefficients of the filter. The method of designing the optimum number of taps and the tap weight coefficients as disclosed in U.S. Pat No. 5,012,245 are incorporated herein. Specifically, these tap weight coefficients would be applied to the analog output signals from the DAC's 120, 122, 124 and 126.

Another embodiment may include a ROM such as the one in FIG. 5 where the data is compressed taking advantage of symmetry in the table and then stored. The data is later expanded by an expansion unit coupled to the output of the ROM after it leaves the ROM in FIG. 6. The corresponding expansion unit must be at a high speed as well.

A sub-assembly may be comprised solely of the ROM having the pre-stored sigma delta digital sequence for possible values of digital input.

Figure 8:
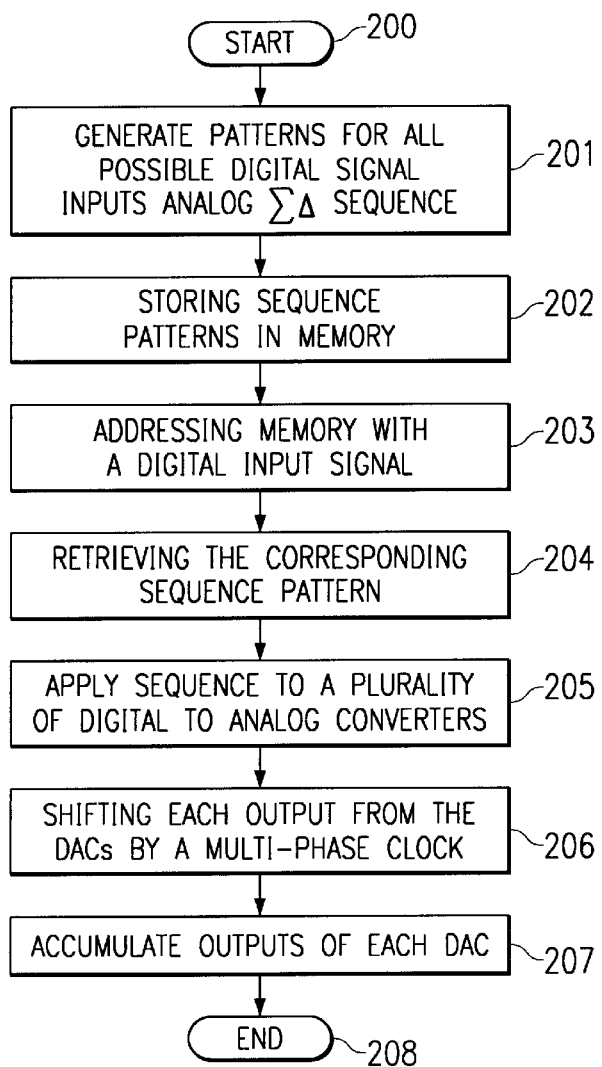
FIG. 8 displays a flow chart of the method of modulating a signal in accordance with the present invention.

A method of converting a digital signal to an analog signal having high speed and resolution is summarized in the flow chart of FIG. 8. At the start (step 200), sigma-delta analog sequence patterns are generated off-line for all possible digital signal inputs as shown in step 201. These sequence patterns are stored in a storage means such as a read-only memory in step 202. After a digital signal input addresses the read-only memory to retrieve the stored sequence pattern in step 203, the analog sequence pattern is retrieved in step 204. This data is applied to a plurality of digital-to-analog converters in step 205. In step 206, each of the plurality of digital-to-analog converters are clocked by a multiphase clock. All the outputs from each digital-to-analog converter are summed to present an output signal in step 207, which ends the process (step 208).

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A delta-sigma digital-to-analog converter having a digital input and an analog output comprising:

a storage means having stored outputs of a delta-sigma converter fed by a number of predetermined interpolated samples of a delta-sigma converter corresponding to all possible values of said digital input, said storage means coupled to receive said digital input, a plurality of digital-to-analog converters coupled to said storage means to receive said stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and a summer coupled to said plurality of digital-to-analog converters for summing all output from said plurality of digital-to-analog converters to generate said analog output.

2. The delta-sigma digital-to-analog converter of claim 1 wherein said storage means is a read/write programmable memory.

3. The delta-sigma digital-to-analog converter of claim 1 wherein said storage means is a read only memory.

4. A delta-sigma digital-to-analog converter having a digital input and an analog output comprising:

a storage means having stored compressed outputs of a delta-sigma converter fed by a number of predetermined interpolated samples of a delta-sigma converter corresponding to all possible values of said digital input, said storage means coupled to receive said digital input;

an expansion unit coupled to said storage means for expanding said compressed outputs;

a plurality of digital-to-analog converters coupled to said expansion unit to receive said expanded stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and a summer coupled to said plurality of digital-to-analog converters for summing all output from said plurality of digital-to-analog converters to generate said analog output.

5. A method for converting a digital signal to an analog signal comprising the steps of:

generating sigma-delta digital output patterns for all possible digital inputs;

storing said output patterns in a table of a storage means;

addressing said storage means by a digital input signal;

retrieving corresponding sequence pattern stored in said table of said storage means;

applying said output pattern to a plurality of digital-to-analog converters;

shifting each of said plurality of digital-to-analog converters by multi-phase clocks wherein each phase is delayed with respect to a next digital-to-analog converter by the oversampling period, equal to the Nyquist period divided by the number of predetermined interpolated samples; and summing the outputs of the plurality of digital-to-analog converters.

6. A method for converting a digital signal to an analog signal comprising the steps of:

generating sigma-delta digital output patterns for all possible digital inputs;

storing said output patterns in a table of a storage means;

addressing said storage means by a digital input signal;

retrieving corresponding sequence pattern stored in said table of said storage means;

applying said output pattern to a plurality of digital-to-analog converters;

shifting each of said plurality of digital-to-analog converters by multi-phase clocks wherein each phase is delayed with respect to a next digital-to-analog converter by the oversampling period equal to the Nyquist period divided by the number of predetermined interpolated samples;

subtracting the output of said plurality of digital-to-analog converters from a delayed version of the sampled digital input signal to form an error signal the amount of delay being substantially the same as the delay through the filter;

determining a number of taps and tap weight coefficients of said plurality of digital-to-analog converters to reduce the error signal;

adjusting the number of taps and the tap weight coefficients of said plurality of digital-to-analog converters; and summing the outputs of said adjusted outputs of said plurality of digital-to-analog converters.

* * * * *